United States Patent [19]

Kang

[11] Patent Number: 5,367,266
[45] Date of Patent: Nov. 22, 1994

[54] FREQUENCY DISCRIMINATOR OF HORIZONTAL SYNCHRONIZING SIGNAL FOR MULTI-MODE MONITOR

[75] Inventor: Keehyun Kang, Pusan, Rep. of Korea

[73] Assignee: Samsung Electron Devices Co., Ltd., Hwasung-kun, Rep. of Korea

[21] Appl. No.: 991,862

[22] Filed: Dec. 15, 1992

[30] Foreign Application Priority Data

Jun. 15, 1992 [KR] Rep. of Korea ............. 92-10651[U]

[51] Int. Cl.⁵ ............................ H03L 7/00; H03K 9/06
[52] U.S. Cl. ......................................... 327/47; 327/3; 327/7
[58] Field of Search ................. 307/522, 523, 524, 510, 307/511, 512, 514, 516; 328/140, 141, 134, 133; 358/158, 159

[56] References Cited

U.S. PATENT DOCUMENTS

| | | | |
|---|---|---|---|
| 3,641,445 | 2/1972 | Green | 328/140 |
| 3,805,171 | 4/1974 | Drumheller | 328/140 |
| 3,812,432 | 5/1974 | Hanson | 328/140 |
| 4,507,578 | 3/1985 | Matsuda | 307/524 |

FOREIGN PATENT DOCUMENTS 89-8733 of 0000 Rep. of Korea.

Primary Examiner—Timothy P. Callahan
Assistant Examiner—Toan Tran
Attorney, Agent, or Firm—Christie, Parker & Hale

[57] ABSTRACT

A frequency discriminator of the horizontal synchronizing signal for a multi-mode monitor has a plurality of filter capacitors connected to horizontal synchronizing signal lines for rejecting noises of a direct current component of the horizontal synchronizing signal. The frequency discriminator also includes a plurality of phase comparator means respectively connected to the filter capacitors for comparing local oscillating frequencies set differently according to each mode with the inputted horizontal synchronizing signal to output one signal representative of the mode of the monitor.

4 Claims, 1 Drawing Sheet

FREQUENCY DISCRIMINATOR OF HORIZONTAL SYNCHRONIZING SIGNAL FOR MULTI-MODE MONITOR

BACKGROUND OF THE INVENTION (1) Field of the Invention

The present invention relates to a frequency discriminator of an input signal and, more particularly frequency discriminator for discriminating a frequency of a horizontal synchronizing signal inputted to a multi-mode monitor providing various screen modes.

(2) Description of the Prior Art

Generally, the font number of a screen displayed on a monitor varies depending on whether the monitor is in a VGA Video Graphic Array mode, a super VGA mode, an IBM 8514A mode, or the like.

For example, in the case of the VGA mode, there are nearly three kinds, including 640×350, 640×400, and 640×480. In the case of the super VGA mode, there is 800×600. In the case of the IBM 8514A mode, there is 1024×768

In a multi-mode monitor providing various screen modes, to automatically control a raster of the screen and any other setting state according to the change of modes, a frequency of an inputted horizontal synchronizing signal has to be discriminated.

A type of technology for discriminating the frequency of an inputted signal such as the above kind is disclosed in the Korean Examined Publication NO. 89-8733 entitled "Circuit for discriminating frequency of supply voltage".

In the above invention, when comparing an output signal of a counter for ranking a supplied frequency of the supply voltage with that of the counter for ranking a reference frequency, if the frequency of the input supply voltage is more than 55 Hz, a signal of high state is outputted. If the frequency of the input supply voltage is less than 55 Hz, a signal of low state is outputted whereby the operation characteristic for discriminating whether the frequency of the input supply voltage is 50 Hz or 60 Hz can be achieved.

However, the above invention has a disadvantage in that, since only the resultant after discriminating whether the frequency of the input signal is larger or smaller than the reference frequency is outputted, while it can be applied to only two kinds of the frequency signals, it cannot be applied to various kinds of the frequency signals. This disadvantage leads to the inconvinence of not discriminating the various kinds of the frequency signals inputted to the multi-mode monitor providing the various modes.

Also, the above conventional discriminating circuit of the supply voltage frequency uses a sine wave signal as the input signal, so that it is difficult to apply a pulse signal to the multi-mode monitor as the input signal.

Another conventional frequency discriminating circuit uses a frequency to voltage converter circuit. An output voltage, varied according to the input signals, is obtained by the frequency to voltage converter circuit and applied to one input terminal of the comparator whose other terminal is supplied with the different reference voltage. Then, the frequency of the input signal is discriminated by the output of the comparator.

However, in the conventional technologies, as a slope is changed in the frequency vs voltage characteristic of the frequency to voltage invertor circuit, the reference voltage of each comparator has to be controlled. In that case, many controlling components may need to be added during production of the frequency discriminating device and also, aging occurs.

SUMMARY OF THE INVENTION

Accordingly, to solve some or all of the conventional disadvantages, an object of the present invention is to provide a frequency discriminator of a horizontal synchronizing signal for a multi-mode monitor which frequency discriminator can discriminate various kinds of frequencies of the horizontal synchronizing signal inputted to a multi-mode monitor providing various screen modes.

To achieve this object, the present frequency discriminator of the horizontal synchronizing signal for the multi-mode monitor has a plurality of filter capacitors which are connected horizontal synchronizing signal lines and reject noises of a direct current component of the horizontal synchronizing signal. The frequency discriminator also includes a plurality of phase comparator means which are connected to the filter capacitors, respectively, and among which one outputs a signal in the case in which the frequencies of two signals are the same when comparing inputted horizontal synchronizing signals with local oscillating-frequencies which are differently set according to each mode.

BRIEF DESCRIPTION OF THE DRAWINGS

Other objects and further advantages of the present invention will be apparent from the detailed description of the preferred embodiment in connection with the accompanying drawings, in which.

DETAILED DESCRIPTION OF THE PREFERRED EMBODIMENTS

Figure 1:
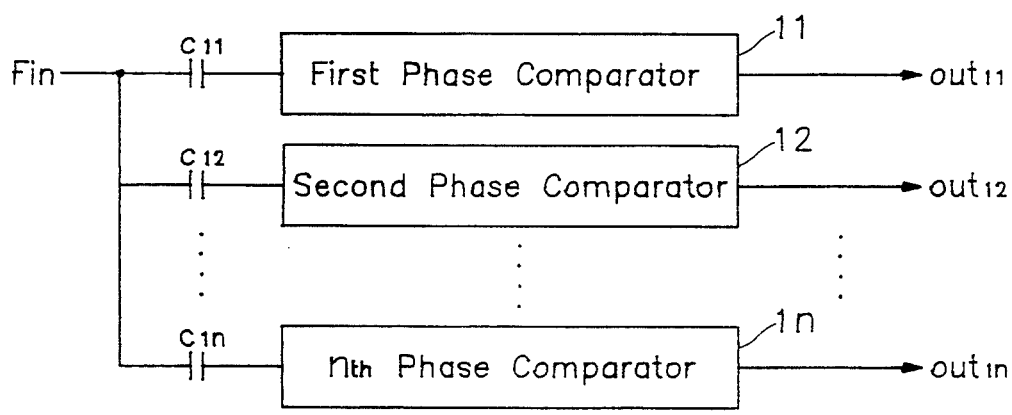
FIG. 1 is a block diagram of a frequency discriminator of a horizontal synchronizing signal for a multi-mode monitor of the present embodiment.

There is illustrated in FIG. 1 a block diagram of a frequency discriminator of a horizontal synchronizing signal for a multimode monitor. In this figure, the frequency discriminator structure of the horizontal synchronizing signal line has filter capacitors $C_{11}-C_{1n}$ for rejecting noises of the direct current component of the number of n. Each is connected to the horizontal synchronizing signal line and 1st-nth phase comparators whose each input terminal is connected to another terminal of the filter capacitors $C_{11}-C_{1n}$. Output terminals of the 1st-nth phase comparators are used as output signal lines $out_{11}-out_{1n}$.

While the present invention uses Signetics' NE/SE567 (Tone Decoder/Phase-Locked Loop) chip as the phase comparator, the present invention does not have to be limited to that.

Figure 2:
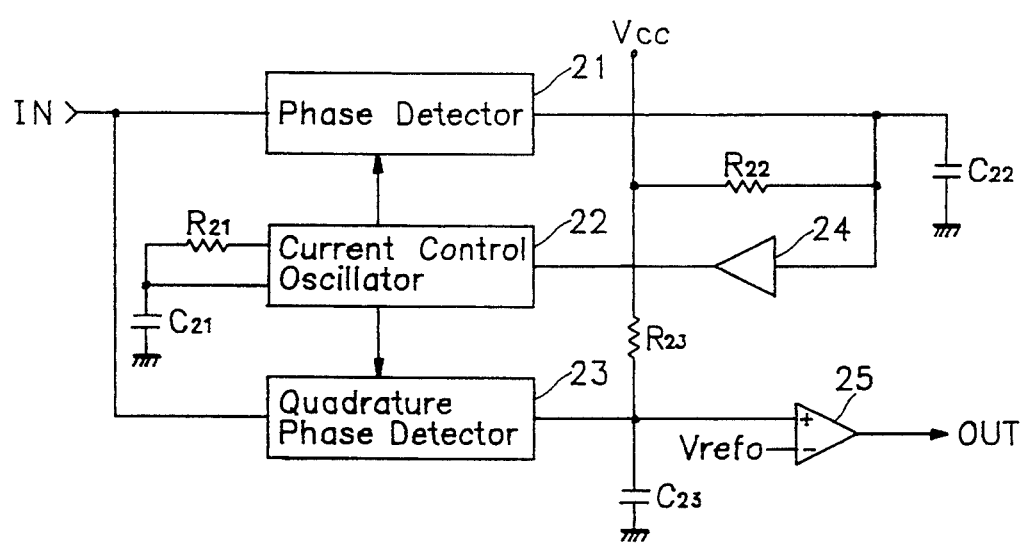
FIG. 2 is a circuit diagram of a phase comparator means of a frequency discriminator of a horizontal synchronizing signal of the present embodiment.

There is illustrated in FIG. 2 a circuit diagram of the phase comparator means of the frequency discriminator of the horizontal synchronizing signal. As shown in this figure, the phase comparator has a phase detector 21 which receives the horizontal synchronizing signal IN from which the direct current signal component has been eliminated by the filter capacitors $C_{11}-C_{1n}$ of the number of n. A low pass filter capacitor $C_{22}$ is connected between an output terminal of the phase detector 21 and a ground. A amplifier 24 has an input terminal connected to a node between the phase detector 21 and the filter capacitor $C_{22}$. A resistor $R_{22}$ is connected between a supply voltage Vcc and the input terminal of the amplifier 24. A current control oscillator 22 has an oscillating-frequency control terminal is connected to an output terminal of the amplifier 24. The phase comparator also includes a quadrature phase detector 23 to which the horizontal synchronizing signal IN is inputted and whose an input terminal is connected to an output terminal of the current control oscillator 22. A resistor $R_{23}$ is connected between the supply voltage Vcc and an output terminal of the quadrature phase detector 23. A output filter capacitor $C_{23}$ is connected between the output terminal of the quadrature phase detector 23 and ground. The phase comparator also includes a comparator component 25 having a non-inverting input terminal connected to the output terminal of the quadrature phase detector 23 and an inverting input terminal to which the reference voltage signal $V_{ref}$ is inputted.

Operation of the frequency discriminator of the horizontal synchronizing signal according to an embodiment of the present invention will be described.

First of all, referring to FIG. 1, the operation of the frequency discriminator of the horizontal synchronizing signal of the present invention will be disclosed.

If the horizontal synchronizing signal $F_{in}$ is inputted to the multi-mode monitor providing the various kinds of screen modes, the direct current component of the horizontal synchronizing signals $F_{in}$ is filtered by the filter capacitor $C_{11}$–$C_{1n}$ to apply the pure signal component IN to the 1st–nth phase comparators 11–1n. The horizontal synchronizing signal IN, without the direct component, applied to the 1st–nth phase comparator 11–1n, are compared with the oscillating-frequency according to each mode set within the 1st–nth phase comparator 11–1n by each phase comparator 11–1n. If the input signal IN is equal to one of the center frequencies set within the 1st–nth phase comparators 11–1n, the low state signal is outputted from the corresponding phase comparator and the high state signal is outputted from the others.

More specifically, if the oscillating-frequencies set within the 1st–nth phase comparator 11–1n are designed to have different values, since there is only one oscillating-frequency in which the frequency is equal to the horizontal synchronizing signal $F_{in}$ inputted to the 1st–nth phase comparator 11–1n, only one phase comparator of the 1st–nth phase comparators 11–1n outputs the low state signal. Thus, in this way, the frequency of the inputted horizontal synchronizing signal $F_{in}$ can be discriminated.

Referring to FIG. 2, the operation of the phase comparator will next be described in detail disclosed.

The horizontal synchronizing signal IN, without the direct current component inputted to the phase comparator, is applied to the phase detector 21 and the quadrature phase detector 23 within the phase comparator. Also, the oscillating-frequency signal set by the time constant elements resistor, $R_{21}$ and the capacitor $C_{21}$, is produced by the current control oscillator 22 to be applied to the phase detector 21 and the quadrature phase detector 23.

In the meantime, the phase detector 21 compares the filtered horizontal synchronizing signal IN with the phase of the local oscillating frequency provided from the current control oscillator 22 to output the signal of phase difference.

The signal of phase difference passes through a low pass filter having the capacitor $C_{22}$ and the resistance $R_{22}$ to be inputted to the amplifier 24.

The control terminal of the current control oscillator 22 having the oscillating-frequency controlled by the direct current is supplied with the signal amplified in the amplifier 24, so that the current control oscillator 22 always generates the constant vibrating output signal (quadrature wave or triangle wave).

The oscillating-frequency signal outputted from the current control oscillator 22 is combined with the filtered horizontal synchronizing signal IN in the quadrature phase detector 23, so that the output signal of the quadrature phase detector 23 has the added and substracted frequency components of the filtered horizontal synchronizing signal IN and the oscillating frequency signal.

The added frequency component is eliminated from the output signal of the quadrature phase detector 23 by the output filter capacitor 23 and the substracted frequency signal is applied to the comparator 25.

The substracted frequency signal inputted to the comparator 25 is compared with the reference voltage signal Vref and then the resultant signal is amplified to be outputted. More particularly, if the substracted frequency signal is less than the reference voltage and there is scarcely any phase difference from each other, the output of the comparator 25 is the signal of low state. If the substracted frequency signal is more than the reference voltage and there is the remarkable phase difference from each other, the output of the comparator 25 is the signal of high state.

Thus, the frequency of the frequency signal $F_{in}$ inputted to the phase comparator can be discriminated by controlling the time constant element resistor $R_{21}$ connected to the current control oscillator 22, the capacitor $C_{21}$, the output filter capacitor $C_{23}$ and the reference voltage signal $V_{ref}$.

As described above, the present invention provides a frequency discriminator of the horizontal synchronizing signal which can discriminate the various kinds of synchronizing signal frequencies inputted to the multi-mode monitor in the multi-mode monitor providing various screen modes.

Although several preferred embodiments of the present invention have been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A frequency discriminator of a horizontal synchronizing signal for a multi-mode monitor comprising:
   a plurality of filter capacitors connected to horizontal synchronizing signal lines for rejecting noises of a direct current component of the horizontal synchronizing signal; and
   a plurality of phase comparator means each connected to a respective filter capacitor for comparing local oscillating frequencies set differently according to each mode with the horizontal synchronizing signal inputted to a specific phase comparator means.

2. A frequency discriminator of a horizontal synchronizing signal for a multi-mode monitor comprising:
   a plurality of filter capacitors connected to horizontal synchronizing signal lines for rejecting noises of a direct current component of the horizontal synchronizing signal to produce filtered horizontal synchronizing signals; and a plurality of phase comparator means each connected to a respective filter capacitor for comparing local oscillating frequencies set differently according to each mode with the filtered horizontal synchronizing signal, each phase comparator means comprising:

a phase detector for detecting the difference of phase between the local oscillating frequency and the filtered horizontal synchronizing signal;

a low pass filter capacitor connected between an output terminal of the phase detector and ground;

an amplifier having an input terminal and an output terminal, the input terminal of the amplifier being connected to an ode between the phase detector and the filter capacitor;

a first resistor connected between a supply voltage and the input terminal of the amplifier;

a current control oscillator for producing the local constant oscillating frequency under the control of output of the amplifier, an oscillating-frequency control terminal of the current control oscillator being connected to the output terminal of the amplifier;

a quadrature phase detector for mixing the filtered horizontal synchronizing signal and the local oscillating frequency of the current control oscillator to output added and subtracted signals;

a second resistor connected between a supply voltage and an output terminal of the quadrature phase detector;

an output filter capacitor connected between the output terminal of the quadrature phase detector and the ground; and a comparator having a non-inverting input terminal connected to the output terminal of the quadrature phase detector and an inverting input terminal to which a reference voltage signal is inputted.

3. A frequency discriminator for identifying a frequency of horizontal synchronizing signals inputted to a multi-mode monitor providing various screen modes, the frequency discriminator comprising:

a plurality of filter means for receiving the horizontal synchronizing signals and filtering the direct current component of the horizontal synchronizing signals to produce filtered horizontal synchronizing signals; and a plurality of comparator means comprising phase detectors for detecting differences in phase between the filtered horizontal synchronizing signals and various oscillating frequencies preset according to each available mode of the monitor.

4. The frequency discriminator of claim 3 wherein each of the plurality of comparator means further comprises time constant resistors and capacitors for producing the oscillating reference frequencies preset according to each available mode of the monitor.

* * * * *